United States Patent
Liu et al.

(10) Patent No.: US 11,664,457 B2
(45) Date of Patent: May 30, 2023

(54) DISPLAY DEVICE AND METHOD OF MANUFACTURING THIN FILM TRANSISTOR

(71) Applicants: AU Optronics (Kunshan) Co., Ltd., Kunshan (CN); AU OPTRONICS CORPORATION, Hsin-Chu (TW)

(72) Inventors: Chin-Chuan Liu, Hsin-Chu (TW); Fu-Liang Lin, Hsin-Chu (TW)

(73) Assignees: AU OPTRONICS (KUSHAN) CO., LTD., Kunshan (CN); AU OPTRONICS CORPORATION, Hsin-Chu (TW)

( * ) Notice: Subject to any disclaimer, the term of this patent is extended or adjusted under 35 U.S.C. 154(b) by 133 days.

(21) Appl. No.: 17/312,706

(22) PCT Filed: Jun. 4, 2019

(86) PCT No.: PCT/CN2019/090003
§ 371 (c)(1),
(2) Date: Jun. 10, 2021

(87) PCT Pub. No.: WO2020/228078
PCT Pub. Date: Nov. 19, 2020

(65) Prior Publication Data
US 2022/0045218 A1    Feb. 10, 2022

(30) Foreign Application Priority Data
May 15, 2019   (CN) .......................... 201910417982.7

(51) Int. Cl.
*H01L 29/786* (2006.01)
*H01L 23/552* (2006.01)
(Continued)

(52) U.S. Cl.
CPC ...... *H01L 29/78633* (2013.01); *H01L 23/552* (2013.01); *H01L 27/1222* (2013.01);
(Continued)

(58) Field of Classification Search
CPC ............. H01L 29/78633; H01L 23/552; H01L 27/1222; H01L 29/66757; H01L 29/78666;
(Continued)

(56) References Cited

U.S. PATENT DOCUMENTS

2003/0155588 A1   8/2003  Murade
2013/0328043 A1   12/2013 Lee
(Continued)

FOREIGN PATENT DOCUMENTS

| CN | 101022085 A | 8/2007 |
| CN | 107331668 A | 11/2017 |
| CN | 108153021 A | 6/2018 |

*Primary Examiner* — Mohammed R Alam
(74) *Attorney, Agent, or Firm* — WPAT, P.C

(57) ABSTRACT

The invention provides a display device and a method of manufacturing a thin film transistor. The method of manufacturing a thin film transistor comprises: (A) providing a substrate; (B) forming a light shielding layer on the substrate, and patterning the light shielding layer to form a patterned light shielding layer; (C) forming a buffer layer on the substrate; (D) forming a semiconductor layer on the substrate, and patterning the semiconductor layer to form a patterned semiconductor layer; (E) forming an insulating layer on the substrate; and (F) forming a conductive layer on the substrate, and patterning the conductive layer to form a patterned conductive layer; wherein the same mask is used for patterning the light shielding layer and the semiconductor layer. Photoelectric effect of the thin film transistor outside the display region can be effectively avoided, while reducing the number of masks in the production process.

3 Claims, 5 Drawing Sheets

(51) Int. Cl.
*H01L 27/12* (2006.01)
*H01L 29/66* (2006.01)

(52) U.S. Cl.
CPC .. *H01L 29/66757* (2013.01); *H01L 29/78666* (2013.01); *H01L 29/78675* (2013.01)

(58) Field of Classification Search
CPC ............. H01L 29/78675; H01L 27/124; H01L 29/78645; H01L 29/78696; H01L 27/1288
See application file for complete search history.

(56) References Cited

U.S. PATENT DOCUMENTS

2014/0209894 A1* 7/2014 Lee .................. H01L 29/66969
257/43
2017/0338252 A1* 11/2017 Lee ..................... H01L 27/1251

* cited by examiner

DISPLAY DEVICE AND METHOD OF MANUFACTURING THIN FILM TRANSISTOR

BACKGROUND OF THE INVENTION

1. Field of the Invention

The invention relates to a display device and a method of manufacturing a thin film transistor in the display device, and particularly to a display device comprising a light shielding layer and a method of manufacturing a thin film transistor.

2. Related Art

With development of science and technology, display devices are widely applied to many electronic products, such as, mobile phones, tablet computers, watches, and the like. In order to improve display quality, the display device with a large size, a high resolution and high brightness emerges as required.

Generally, in the process of making an active element array substrate, the display device forms a light shielding layer below the thin film transistor in the display region to avoid photoelectric effect generated by the thin film transistor. FIG. 1A is a top view of a thin film transistor structure in a display device of the prior art, FIG. 1B is a sectional view along A-A' of FIG. 1A, and FIG. 1C is a sectional view along B-B' of FIG. 1A. As shown in FIGS. 1A, 1B and 1C, the thin film transistor 10 comprises a substrate 11 on which a light shielding layer 12, a buffer layer 13, a semiconductor layer 14, a gate insulating layer 15, a first metal layer 16, an interlayer insulating layer 17 and a second metal layer 18 are sequentially formed. A first heavy doped region SD and a second heavy doped region SD are formed on both sides of the semiconductor layer 14, a channel region CH and a lightly doped region N— are formed between the first heavy doped region SD and the second heavy doped region SD, and the second metal layer 18 is electrically connected to the semiconductor layer 14 through a contact hole 19. As can be seen from FIG. 1C, the light shielding layer 12 of the thin film transistor 10 in the display device of the prior art is only formed at a position corresponding to the channel region CH of the semiconductor layer 14, and the light shielding layer 12 is slightly wider than the semiconductor layer 14. In addition, the light shielding layer 12 and the semiconductor layer 14 in the prior art are formed by patterning with two different masks, respectively.

Therefore, how to effectively avoid photoelectric effect of the thin film transistor outside the display region, while reducing the number of masks in the production process is actually one of the problems to be solved.

SUMMARY OF THE INVENTION

To solve the above problem, the invention provides a display device and a method of manufacturing a thin film transistor, which can effectively avoid photoelectric effect of the thin film transistor outside the display region, while reducing the number of masks in the production process.

A method of manufacturing a thin film transistor in the embodiment of the invention, comprises:

(A) providing a substrate;

(B) forming a light shielding layer on the substrate, and patterning the light shielding layer to form a patterned light shielding layer;

(C) forming a buffer layer on the substrate;

(D) forming a semiconductor layer on the substrate, and patterning the semiconductor layer to form a patterned semiconductor layer;

(E) forming an insulating layer on the substrate; and (F) forming a conductive layer on the substrate, and patterning the conductive layer to form a patterned conductive layer;

wherein the same mask is used for patterning the light shielding layer and the semiconductor layer.

In the manufacturing method, the step of patterning the semiconductor layer uses an over etching manner.

In the manufacturing method, the patterned light shielding layer and the patterned semiconductor layer are completely overlapped.

In the manufacturing method, a size of the patterned light shielding layer is greater than a size of the patterned semiconductor layer.

In the manufacturing method, the light shielding layer is a light shielding metal layer, and can be titanium, molybdenum, chromium, iridium, aluminum, copper, silver, gold or any combination thereof.

In the manufacturing method, the semiconductor layer can be amorphous silicon and polycrystalline silicon.

In the manufacturing method, the thin film transistor is a thin film transistor in a display panel.

In the manufacturing method, the thin film transistor is a thin film transistor in a multiplexer circuit, or a thin film transistor in a gate driving shift register.

A display device in the embodiment of the invention comprises: a first substrate having a first thin film transistor and a second thin film transistor, wherein the first thin film transistor and the second thin film transistor each comprises: a light shielding layer disposed on the first substrate; a buffer layer covered above and on a lateral side of the light shielding layer; a semiconductor layer disposed above the buffer layer, such that the buffer layer is located between the semiconductor layer and the light shielding layer, and the semiconductor layer having a first doped region, a second doped region and a channel region between the first doped region and the second doped region; a first insulating layer disposed above the semiconductor layer; a first metal layer disposed above the first insulating layer, and having an overlapped region with the channel region in a vertical projection direction; a second insulating layer covered on the first metal layer; and a second metal layer disposed above the second insulating layer, and connected to the first doped region or the second doped region; wherein a projection area of the semiconductor layer projected vertically on the first substrate is less than a projection area of the light shielding layer projected vertically on the first substrate.

In the display device, a projection shape of the semiconductor layer projected vertically on the first substrate is the same as a projection shape of the light shielding layer projected vertically on the first substrate.

In the display device, the first substrate has a display region and a peripheral circuit region on a periphery of the display region, wherein the first thin film transistor is located in the display region, and the second thin film transistor is located in the peripheral circuit region.

In the display device, a projection area of the light shielding layer of the second thin film transistor projected vertically on the first substrate is greater than a projection area of the light shielding layer of the first thin film transistor projected vertically on the first substrate.

In the display device, a projection shape of the light shielding layer of the second thin film transistor projected vertically on the first substrate is different from a projection shape of the light shielding layer of the first thin film transistor projected vertically on the first substrate Hereinafter the invention is described in details with reference to the accompanying drawings and the detailed embodiments, but the invention is not limited thereto.

PREFERABLE EMBODIMENTS OF THE INVENTION

Figure 1A:
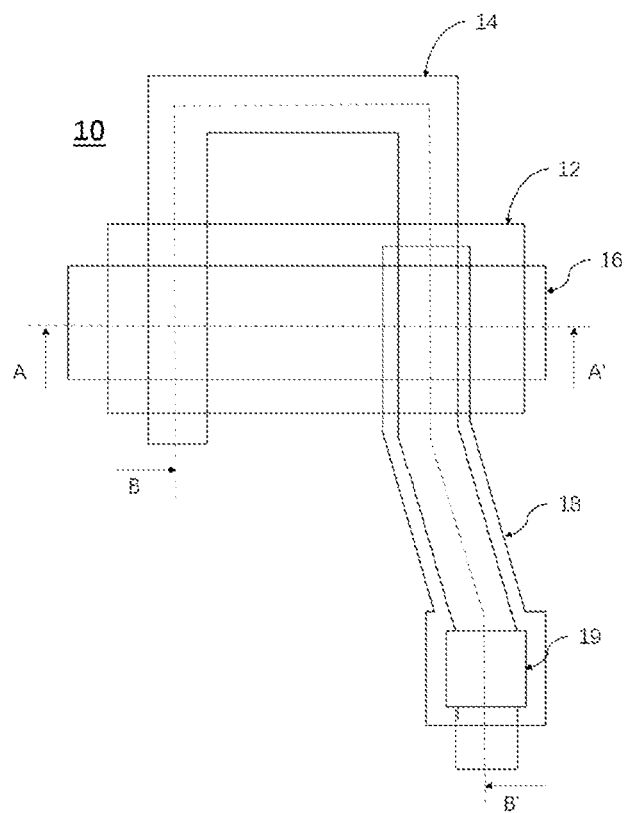
FIG. 1A is a top view of a thin film transistor structure in a display device of the prior art.
Figure 1B:
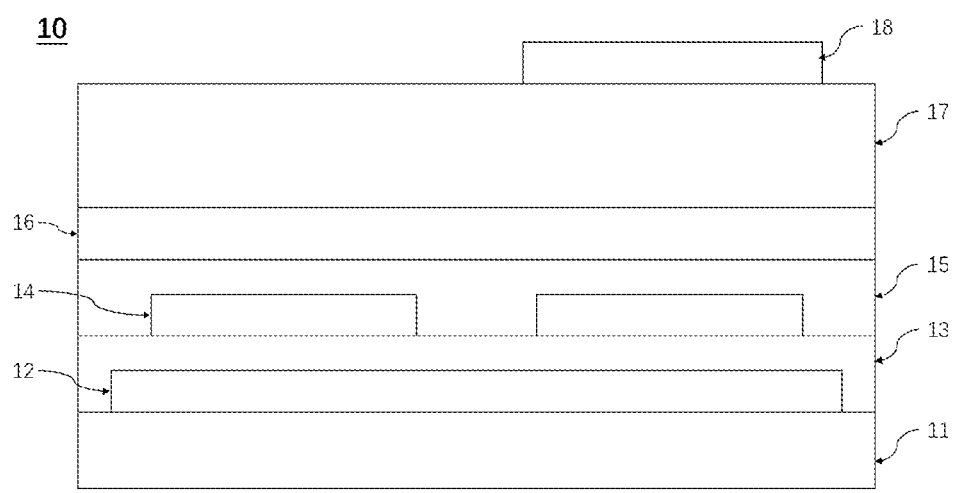
FIG. 1B is a sectional view along A-A' of FIG. 1A.
Figure 1C:
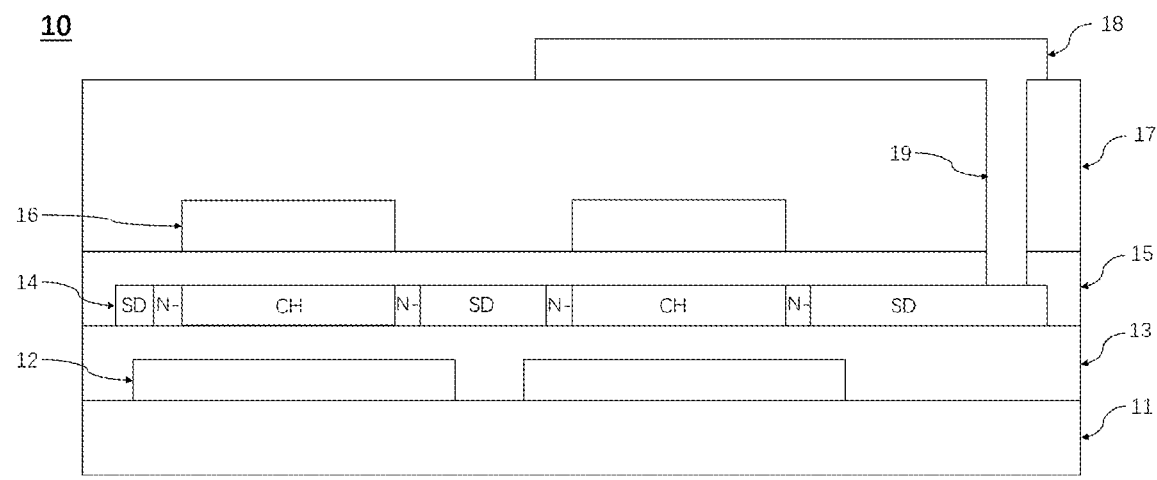
FIG. 1C is a sectional view along B-B' of FIG. 1A.
Figure 2A:
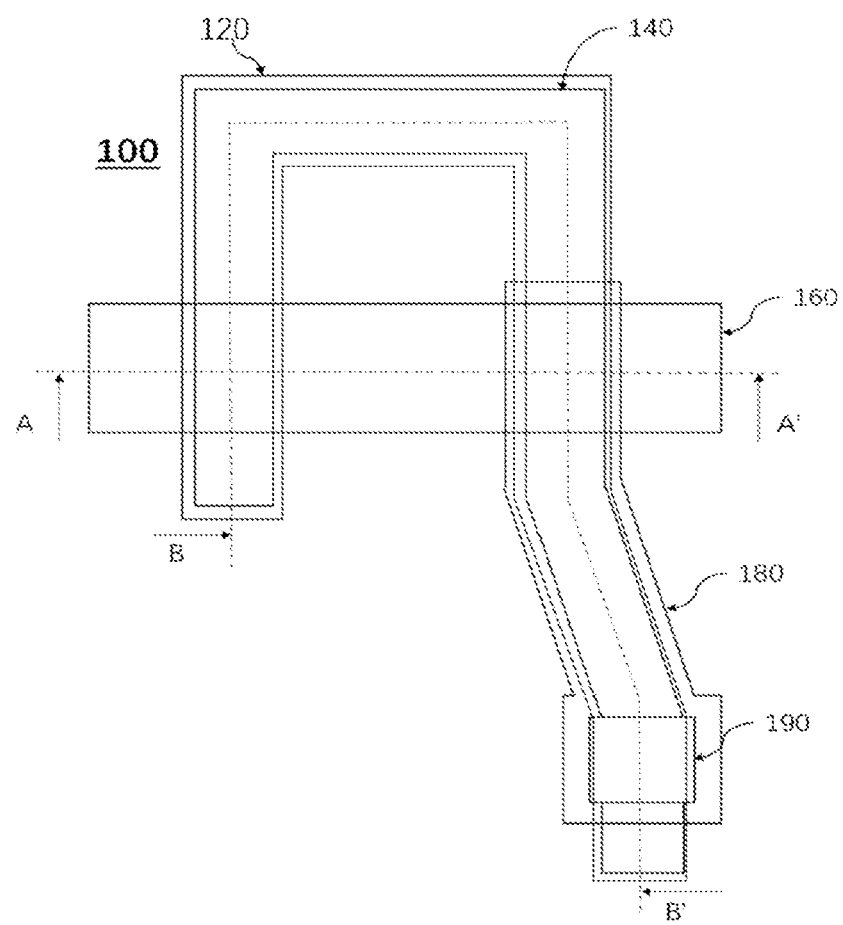
FIG. 2A is a top view of a thin film transistor structure in one embodiment of the invention.
Figure 2B:
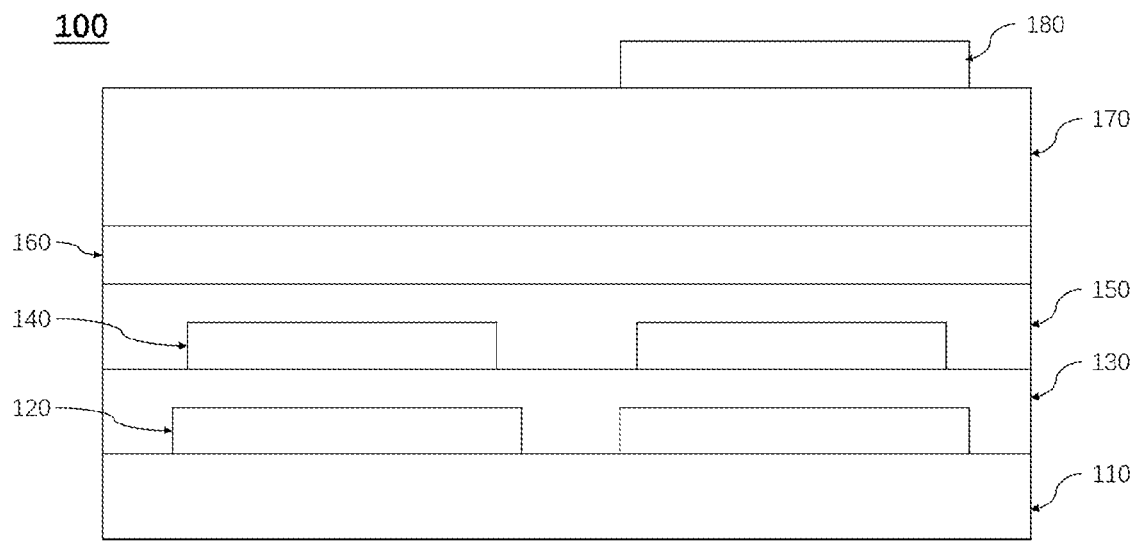
FIG. 2B is a sectional view along A-A' of FIG. 2A.
Figure 2C:
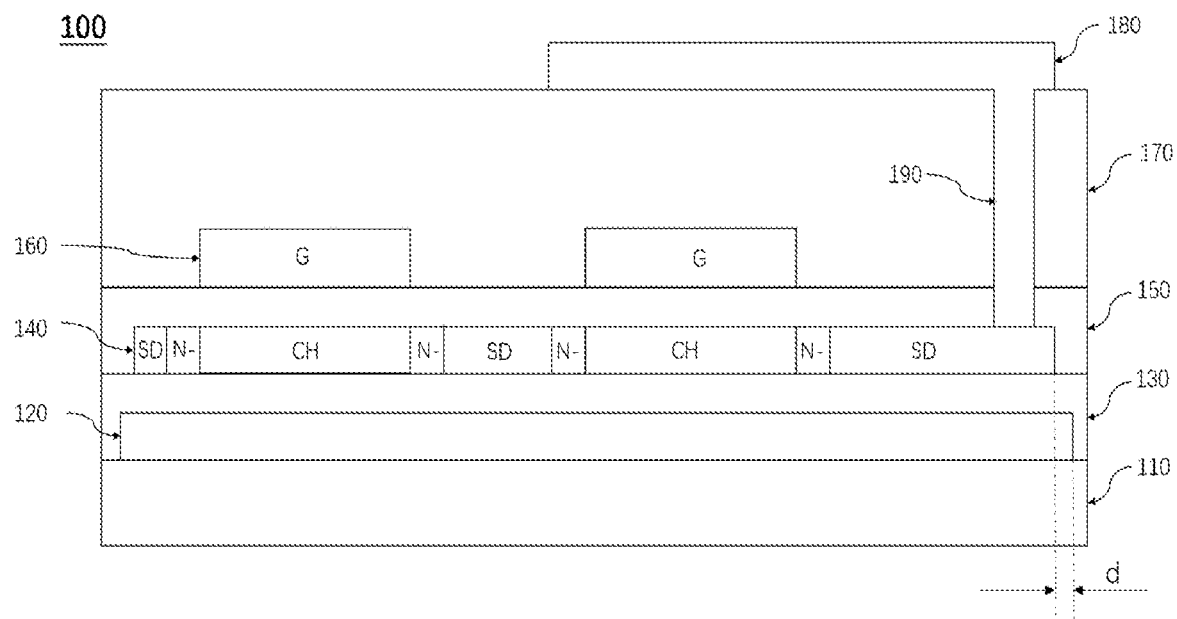
FIG. 2C is a sectional view along B-B' of FIG. 2A.

Hereinafter structure principle and working principle of the invention are described in details with reference to the accompanying drawings:

FIG. 2A is a top view of a thin film transistor structure in one embodiment of the invention, FIG. 2B is a sectional view along A-A' of FIG. 2A, and FIG. 2C is a sectional view along B-B' of FIG. 2A. As shown in FIGS. 2A, 2B and 2C, a method of manufacturing a thin film transistor 100 comprises:

(A) providing a substrate 110;

(B) firstly, forming a light shielding layer 120 on the substrate 110, and patterning the light shielding layer 120 using a mask to form a patterned light shielding layer 120. In this embodiment, the light shielding layer 120 is a light shielding metal layer, can be titanium, molybdenum, chromium, iridium, aluminum, copper, silver, gold or any combination thereof, and can be patterned using an etching manner, but the invention is not limited thereto;

(C) forming a buffer layer 130 on the substrate 110, the buffer layer 130 covering the patterned light shielding layer 120 and the substrate 110;

(D) forming a semiconductor layer 140 on the buffer layer 130, wherein the semiconductor layer 140 can be made of other semiconductor materials such as, amorphous silicon and polycrystalline silicon, but the invention is not limited thereto; and patterning the semiconductor layer 140 using the same mask as the patterned light shielding layer 120 to form a patterned semiconductor layer 140. In this embodiment, the patterned semiconductor layer 140 may use an etching manner, and as compared to etching of the patterned light shielding layer 120, etching of the patterned semiconductor layer 140 is an over etching manner. Accordingly, as can be seen from FIGS. 2B and 2C, the light shielding layer 120 is formed below the patterned semiconductor layer 140, the semiconductor layer 140 and the light shielding layer 120 are completely overlapped, and a size of the light shielding layer 120 is greater than a size of the semiconductor layer 140. In other words, a projection area of the semiconductor layer 140 projected vertically on the substrate 110 is less than a projection area of the light shielding layer 120 projected vertically on the substrate 110. In this embodiment, a distance between an outer edge of the light shielding layer 120 and an outer edge of the semiconductor layer 140 is d, such as, 0.5 μm, and a size of d also can be selected according to material and thickness of the light shielding layer 120, but the invention is not limited thereto. After the semiconductor layer 140 is formed, the semiconductor layer 140 is doped, and a first heavy doped region SD and a second heavy doped region SD are formed on both sides of the semiconductor layer 140. The first heavy doped region SD forms a source electrode of the thin film transistor 100, the second heavy doped region SD forms a drain electrode of the thin film transistor 100, and a channel region CH and a lightly doped region N— are formed between the first heavy doped region SD and the second heavy doped region SD.

(E) forming a gate insulating layer 150 on the substrate 110, the gate insulating layer 150 covering the patterned semiconductor layer 140 and the substrate 110; and (F) forming a first metal layer 160 on the substrate 110, wherein the first metal layer 160 can be titanium, molybdenum, chromium, iridium, aluminum, copper, silver, gold or any combination thereof, and patterning the first metal layer 160 to form a patterned first metal layer 160, the patterned first metal layer 160 forming a gate electrode G of the thin film transistor 100;

(G) forming an interlayer insulating layer 170 on the substrate 110;

(H) forming a second metal layer 180 on the substrate 110, wherein the second metal layer 180 can be titanium, molybdenum, chromium, iridium, aluminum, copper, silver, gold or any combination thereof, and patterning the second metal layer 180 to form a patterned second metal layer 180. In this embodiment, the second metal layer 180 is electrically connected to the semiconductor layer 140 (the first heavy doped region SD or the second heavy doped region SD) through a contact hole 190.

Of course, the thin film transistor 100 is also formed by many other layers, but the invention only makes exemplary description, and is not limited thereto.

Figure 3:
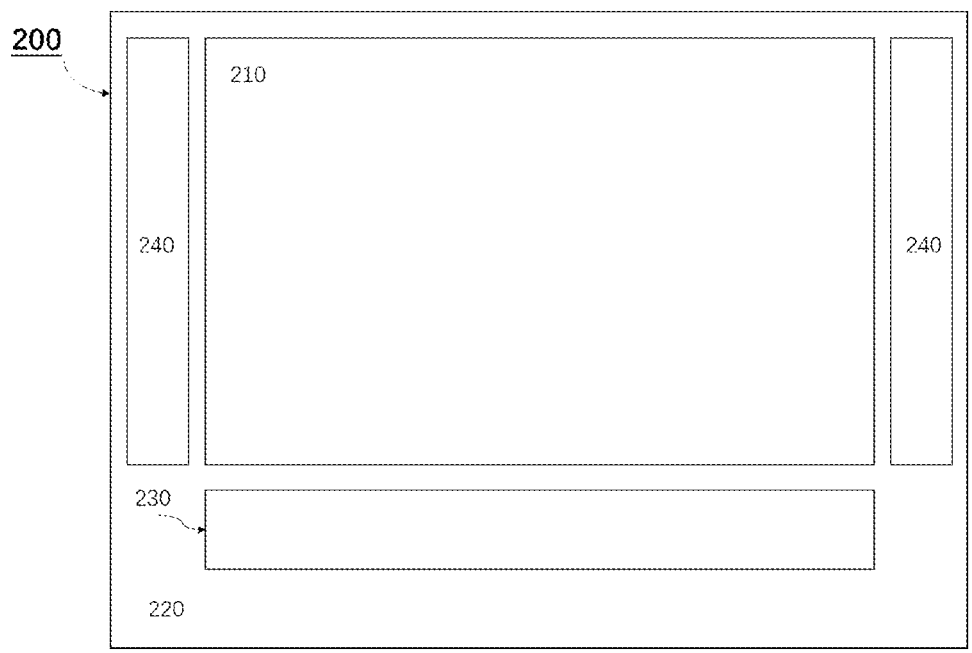
FIG. 3 is a structural diagram of a display device in one embodiment of the invention.

FIG. 3 is a structural diagram of a display device in one embodiment of the invention. As shown in FIG. 3, the display device 200 in this embodiment comprises a display region 210 and a peripheral region 220 formed on a substrate (not shown), and the peripheral region 220 surrounds the display region 210. In the embodiment of FIG. 3, the peripheral region 220 surrounds the display region 210, but the invention is not limited thereto. In another embodiment, the peripheral region 220 is only disposed on a single lateral side or both lateral sides of the display region 210. Specifically, an array of a plurality of pixel units (not shown) is disposed in the display region 210. In the embodiment of FIG. 3, the display device 200 or the display region 210 is rectangular, but the invention is not limited thereto, and the display device 200 or the display region 210 also may be a circle, an oval, other irregular arc, a triangle, a pentagon or other polygon due to different designs and requirements. In addition, the plurality of pixel units may be aligned or interleaved into an array. A multiplexer (MUX) 230, a gate driving shift register (SR) 240 and the like are formed in the peripheral region 220, and the MUX 230 and the gate driving SR are one or more, but the invention is not limited thereto. The pixel units, the MUX 230 and the gate driving SRs 240 are all formed with thin film transistors, and the thin film transistors are formed using the foregoing manufacturing method.

Specifically, in this embodiment, the MUX 230 is formed of a plurality of thin film transistors, and the process step of manufacturing the plurality of thin film transistors of the MUX 230 may be formed in accordance with the process step in the forgoing embodiment. Therefore, the light shielding layer and the semiconductor layer of the thin film transistors in the peripheral region 220 are a two-layer patterned structure with different areas formed through the same mask and further different degrees of etching. Accordingly, cost of one layer of masks can be reduced, and influence of photoelectric effect also can be considered. Similarly, the gate driving SR 240 is also formed of a plurality of thin film transistors, and also can be formed through the manufacturing process step in the forgoing embodiment. The details are not described here.

In the display device of this embodiment, functions of circuit of the pixel units and circuit of the peripheral region (such as, the MUX 230, the gate driving SR 240, etc.) are different, so structures or sizes of the thin film transistors of the respective circuits are of different designs. For example, in the circuit of the peripheral region, a size of the thin film transistor is relatively greater than a size of the thin film transistor in the circuit of the pixel units. Therefore, a projection area of the light shielding layer of the thin film transistors in the MUX 230 and the gate driving SR 240 projected vertically on the substrate is greater than a projection area of the light shielding layer of the thin film transistor in the pixel units projected vertically on the substrate. Alternatively, in the circuit of the peripheral region, although forming layers of the thin film transistor are the same as that in the circuit of the pixel units, layout patterns are different. In other words, a shape of the thin film transistors in the MUX 230 and the gate driving SR 240 is also different from a shape of the thin film transistor in the pixel units, and a projection shape of the light shielding layer of the thin film transistors in the MUX 230 and the gate driving SR 240 projected vertically on the substrate is also different from a projection shape of the light shielding layer of the thin film transistor in the pixel units projected vertically on the substrate.

Of course, other circuits are also arranged in the peripheral region, such as, an electrostatic discharge protection circuit, a testing circuit, a switching circuit and the like, the circuits are also formed of thin film transistors, and the thin film transistors also can be formed using the foregoing manufacturing method. In the embodiment of FIG. 3, the gate driving SRs 240 are arranged in the peripheral region 220, but the invention is not limited thereto. In another embodiment with a narrow bezel, the gate driving SRs 240 are arranged in the display region 210, and also can form a thin film transistor using the manufacturing process step in the foregoing embodiment. The details are not described here.

In conclusion, according to the embodiments of the invention, since the semiconductor layer and the light shielding layer of the thin film transistor use the same mask, one layer of masks can be reduced in the production process, thereby saving production cost. Moreover, the thin film transistor in the pixel units of the display device, and the thin film transistors in the MUX 230 and the gate driving SR 240 are all formed with light shielding layers below all semiconductor layers. Accordingly, photoelectric effect of the thin film transistor in the pixel units are avoided, and photoelectric effect of the thin film transistors in the MUX 230 and the gate driving SR 240 also can be avoided. In addition, since the semiconductor layer is formed by an over etching manner as compared to the light shielding layer, sizes of the light shielding layer 120 in all directions are greater than the size of the semiconductor layer, and the light shielding layer can avoid photoelectric effect generated by the semiconductor layer in a direction perpendicular to the substrate, and also can avoid photoelectric effect generated by the semiconductor layer in all directions of the periphery of the semiconductor layer Of course, the invention also may have various other embodiments, and those skilled in the art shall make various corresponding changes and variations without departing from spirit and essence of the invention, but these corresponding changes and variations shall belong to the scope protected by the appended claims of the invention.

INDUSTRIAL PRACTICABILITY

Application of the display device and the method of manufacturing a thin film transistor of the invention has the following advantageous effects:

effectively avoid photoelectric effect of the thin film transistor outside the display region, while reducing the number of masks in the production process.

What is claimed is:

1. A display device, comprising: a first substrate having a first thin film transistor and a second thin film transistor, wherein the first thin film transistor and the second thin film transistor each comprises: a light shielding layer disposed on the first substrate; a buffer layer covered above and on a lateral side of the light shielding layer; a semiconductor layer disposed above the buffer layer, such that the buffer layer is located between the semiconductor layer and the light shielding layer, and the semiconductor layer having a first doped region, a second doped region and a channel region between the first doped region and the second doped region; a first insulating layer disposed above the semiconductor layer; a first metal layer disposed above the first insulating layer, and having an overlapped region with the channel region in a vertical projection direction; a second insulating layer covered on the first metal layer; and a second metal layer disposed above the second insulating layer, and connected to the first doped region or the second doped region; wherein a projection area of the semiconductor layer projected vertically on the first substrate is less than a projection area of the light shielding layer projected vertically on the first substrate, wherein the first substrate has a display region and a peripheral circuit region on a periphery of the display region, wherein the first thin film transistor is located in the display region, and the second thin film transistor is located in the peripheral circuit region, and a projection area of the light shielding layer of the second thin film transistor projected vertically on the first substrate is greater than a projection area of the light shielding layer of the first thin film transistor projected vertically on the first substrate.

2. The display device according to claim 1, wherein a projection shape of the semiconductor layer projected vertically on the first substrate is the same as a projection shape of the light shielding layer projected vertically on the first substrate.

3. The display device according to claim 1, wherein a projection shape of the light shielding layer of the second thin film transistor projected vertically on the first substrate is different from a projection shape of the light shielding layer of the first thin film transistor projected vertically on the first substrate.

* * * * *